US006404192B1

United States Patent
Chiesi et al.

(10) Patent No.: US 6,404,192 B1
(45) Date of Patent: Jun. 11, 2002

(54) INTEGRATED PLANAR FLUXGATE SENSOR

(75) Inventors: Laurent Chiesi, Saint-Julien en Genevois (FR); Pavel Kejik, Ecublens (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/570,436

(22) Filed: May 12, 2000

(30) Foreign Application Priority Data

May 12, 1999 (EP) ............................................. 99109504

(51) Int. Cl.$^7$ ................................................ G01R 33/04
(52) U.S. Cl. ........................................ 324/253; 336/232
(58) Field of Search .................................. 324/253, 254, 324/255; 336/200, 232; 33/361

(56) References Cited

U.S. PATENT DOCUMENTS

| 4,267,640 A | 5/1981 | Wu |
| 5,014,006 A | 5/1991 | Seitz |

FOREIGN PATENT DOCUMENTS

| DE | 37 38 455 | 6/1988 |
| EP | 0 284 196 | 9/1988 |
| GB | 1179841 | 2/1970 |

OTHER PUBLICATIONS

Choi, S. O. et al; "An Integrated Micro Fluxgate Magnetic Sensor", *Sensors and Actuators;* Elsevier Science S.A.; vol. A55, No. 2/03; Jul. 31, 1996; pp. 121–126; XP00641635.

*Primary Examiner*—Walter E. Snow
(74) *Attorney, Agent, or Firm*—Griffin & Szipl, P.C.

(57) ABSTRACT

Planar magnetic sensor, made in particular via CMOS techniques on a semiconductor substrate (1) of for example parallelepiped shape. It includes an amorphous ferromagnetic core (10) in the shape of a Greek cross which occupies the two diagonals of the square defined by the outer contour (90) of the excitation coil (9), the latter being made in the form of a planar winding of square shape. One thus measures, via flat detection coils (70, 80 and 71, 81) which are mounted in series and in a differential arrangement, the two orthogonal components (H1, H2) of the external magnetic field (Hext).

9 Claims, 4 Drawing Sheets

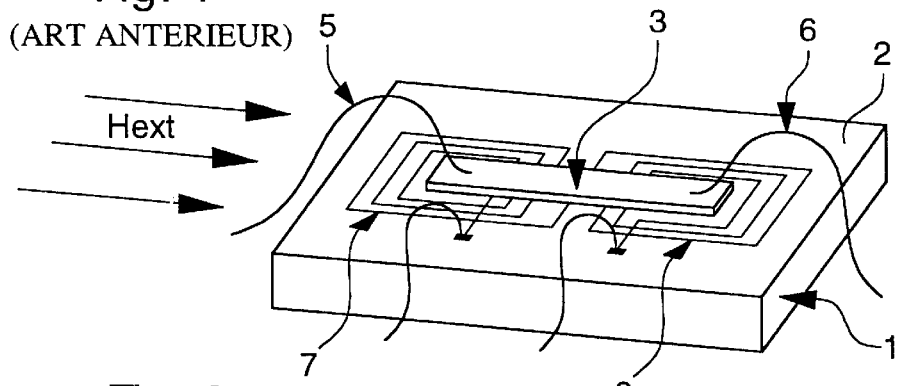
Fig. 1 (ART ANTERIEUR)
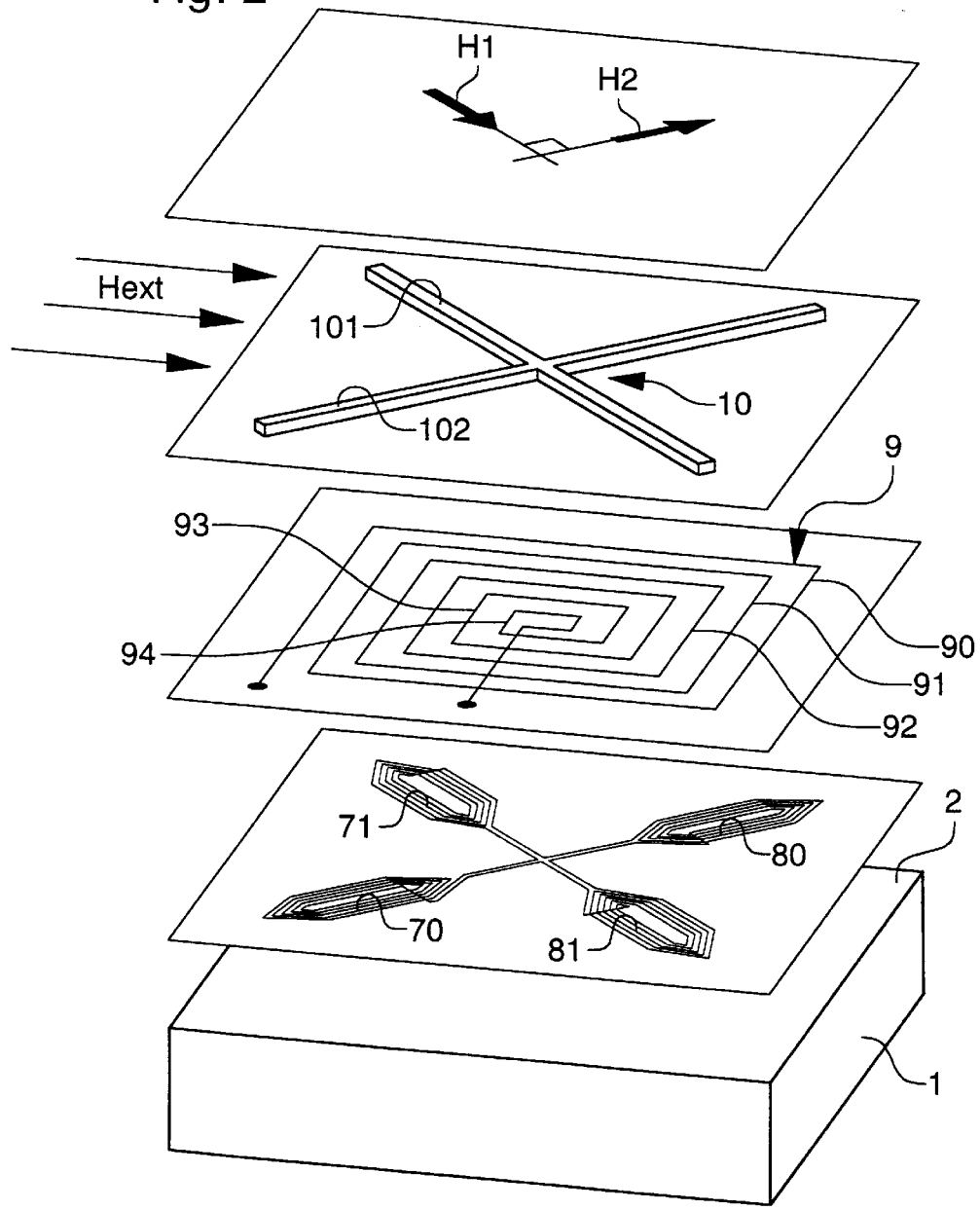
Fig. 2 a)

b)

INTEGRATED PLANAR FLUXGATE SENSOR

The present invention relates to a substantially planar magnetic sensor made in particular on an integrated circuit, this magnetic sensor being of the fluxgate type and being typically intended to be fitted to a magnetometer for detecting, in a plane, magnetic fields of very low value, for example for medical applications. This magnetometer is then preferably made using CMOS techniques, with its associated electronic circuit integrated in the substrate on which the sensor is made.

The publication "Integrated Planar Fluxgate Sensor With Amorphous Metal Core" by Messrs. L. Chiesi, J. A. Flaganan, B. Jannosy, and R. S. Poponic of the Swiss Federal Institute of Technology of Lausanne (Switzerland), presented at the "EuroSensors XI" conference in Poland, 1997 can be cited as the state of the art.

This publication describes a planar magnetic micro-sensor integrated on a silicon substrate, which is shown in FIG. 1 annexed as an illustration of the prior art.

As is seen in FIG. 1, this magnetic sensor, or "fluxgate" sensor is made, by CMOS integration techniques, to a silicon micro-substrate 1, or "silicon chip", formed by a plate of parallelepiped shape.

This micro-sensor is integrated on the large top face 2 of parallelepiped substrate 1, the latter being positioned, with respect to the external magnetic field to be measured Hext, so that large face 2 is practically coplanar to external field Hext.

The actual magnetic sensor includes a metal tape 3 of amorphous metal material through which flows an excitation current carried by two aluminium wires 5, 6 respectively welded to each end of tape 3. This excitation current is an ac current of frequency f, of triangular shape, which generates a magnetic field, of the same frequency, which, because of the non-linear nature of the curve B-H (magnetic flux-magnetic field) of the tape of amorphous ferromagnetic core 3, periodically saturates ferromagnetic material 3.

The sensor includes two coplanar detection coils 7 and 8, mounted in series and in opposition, i.e. in differential arrangement, which are each placed respectively at one end of amorphous ferromagnetic tape or core 3, where they thus each measure the leakage field at these respective ends.

Because of the non-linear permeability of amorphous ferromagnetic core 1, the voltage detected by each coil 7 or 8 contains harmonics of excitation frequency f, of which only the even harmonics are interesting since they are proportional to the external magnetic field Hext to be measured. Generally, detection is thus carried out on frequency 2f.

This known device has the drawback, on the one hand, of not allowing external field Hext to be measured along two orthogonal directions, without having to change the relative position of the sensor, and on the other hand, of lacking sensitivity. Moreover its output voltage is dependent on the frequency of the excitation current and its current consumption is relatively high.

An object of the invention is to provide a magnetic sensor which is similar to the sensor according to FIG. 1, but which does not have the aforecited drawbacks and is greatly improved as regards its performance, in particular its lower current consumption and its ability to detect external magnetic fields Hext of very low intensity and to detect magnetic fields along two orthogonal directions.

The invention therefore concerns a substantially planar magnetic sensor, made on a semiconductor substrate, this sensor including:

one or more magnetic cores which are substantially planar and made on a large planar face of the substrate;

at least one excitation circuit; and at least one detection circuit formed by at least two planar detection coils also made on this large face of the substrate, characterised in that said excitation circuit is formed by a single planar coil of substantially square external shape, and in that said magnetic core or cores are long-limbed cores which are arranged, in a Greek cross, along the two diagonals of the geometric square defined by the outer contour of said planar excitation coil.

According to a preferred embodiment, there is only one said magnetic coil and it is monoblock and has the shape of a Greek cross arranged along said diagonals. Advantageously, in this case, the detection circuit is formed by four detection coils which are respectively placed at the four free ends of said magnetic core in the shape of a monoblock Greek cross. Preferably, the material forming the magnetic core or cores is amorphous.

The invention will be understood more clearly, and its advantages and other features will appear, during the following description of two non-limiting embodiments, with reference to the schematic diagram in which:

FIG. 1, described previously, shows a magnetic micro-sensor of the prior art;

FIG. 2 is a partial exploded perspective view of a preferred embodiment of the magnetic micro-sensor according to the invention;

Figure 3:
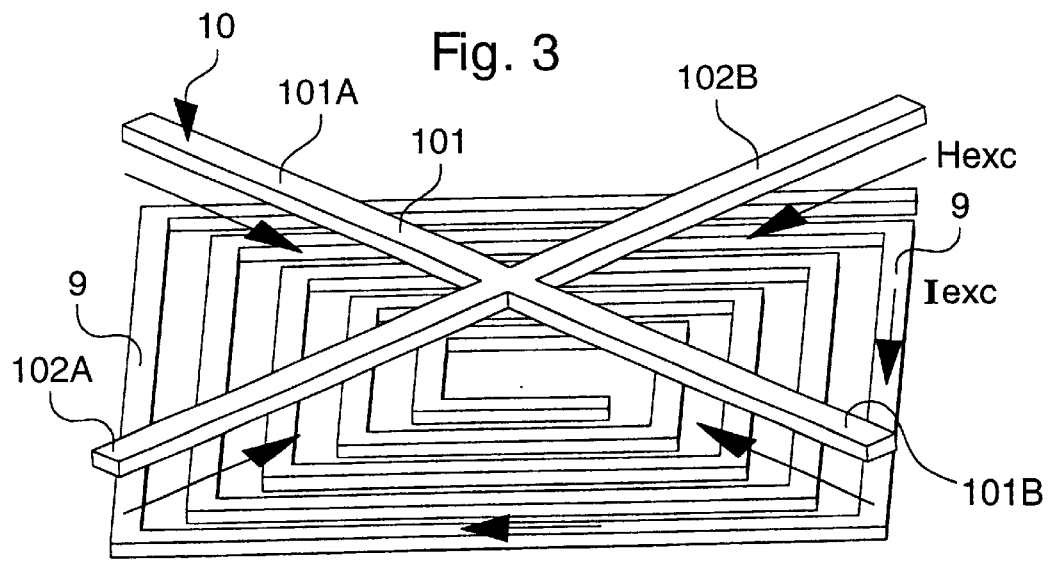
FIG. 3 is a partial view, limited to the magnetic core and its excitation coil, showing the direction of the excitation fields in each of the four half branches of the magnetic core.

In FIG. 2, the substrate of parallelepiped shape, similar to that of the sensor of the prior art described previously with reference to FIG. 1, has again been designated by the reference 1. This substrate includes, made by CMOS integration on its large top surface 2, the electronic circuit which is associated with the magnetic sensor to make the complete magnetometer, this integrated electronic circuit not being shown in this Figure.

This sensor includes an excitation coil 9 which is planar and made on face 2 of substrate 2, this coil 9 having an outer contour, formed by its outer turn 90, of substantially square shape. The other turns 91 to 94 of excitation coil 9 are concentric to outer turn 90, are also square in shape and are, as shown, of progressively decreasing dimensions.

A ferromagnetic core 10 is made on excitation coil 9, typically by bonding, said core being formed by an amorphous magnetic material, as is the case for the prior device of FIG. 1, typically from a commercially available tape of amorphous ferromagnetic metal.

However, according to the present invention, ferromagnetic core 10 has the shape of a Greek cross, this shape coinciding with the two perpendicular diagonals of the square defined by outer turn 90 of excitation coil 9, i.e. of the geometric square defined by the coil.

Two perpendicular components H1 and H2 of external magnetic field Hext can thus be measured, these two components being respectively directed along the two orthogonal branches 101 and 102 of core 10. Component H1 is then measured by branch 101 of core 10, while component H2 is measured by its orthogonal branch 102.

Detection is carried out here by two coplanar pairs of detection coils, namely:

a first pair of planar detection coils 70, 80 also made by CMOS techniques onto face 2 of substrate 1 and below planar excitation coil 9, these two detection coils being mounted in series and in a differential arrangement, and being respectively positioned under one of the two free ends of branch 102 of core 10. This first pair 70, 80 thus has the role of detecting component H2 of external field Hext.

a second pair of detection coils 71, 81, identical to the two coils 70, 80, these two coils also being mounted in series and in a differential arrangement, and being respectively positioned under one of the two free ends of the other branch 101 of core 10. This second pair of planar coils 71, 81 has the role of detecting component H1 of external field Hext.

FIG. 3 shows excitation coil 9, with the direction of the excitation current Iexc, the latter being further formed of alternate negative and positive pulses and with a low duty cycle, of the order of 1/8 to give an idea, and this Figure shows the direction of the magnetic excitation field Hexc consequently generated in each of half branches 101A, 101B, 102A, 102B of core 10.

It can be seen that, in each of half branches 101A, 101B of a same branch 101 of core 10, excitation fields Hexc created by excitation current Iexc are of opposite directions.

As a result, in each branch 101 or 102, of core 10, the external magnetic field Hext to be measured sees a core length equivalent to the totality of the length of the branch, while excitation field Hexc sees only a core length equivalent to half of the length of said branch. Consequently, the external magnetic field sees a ferromagnetic core which possesses an equivalent apparent permeability which is greater than that of the excitation field, which eventually greatly increases the sensitivity of the sensor.

Figure 4:
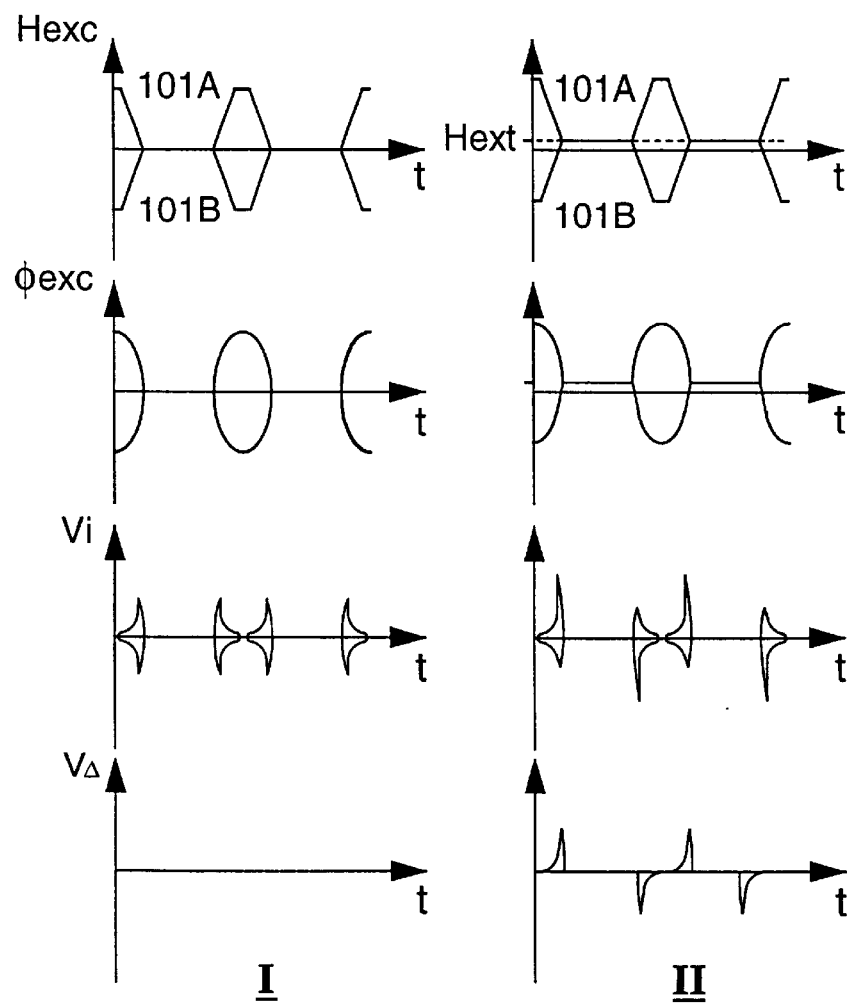
FIG. 4 is a time diagram explaining the operation of the sensor.

FIG. 4 shows the operating principle of the sensor, applied to one of the two branches of core 10, i.e. to the measurement of one of the two components H1 or H2 of the external magnetic field Hexc to be measured.

The left half of this Figure is a first series I of four curves showing the variation, as a function of time t, of the excitation field Hexc in one of the core's branches, 101, for example, of the corresponding excitation flux φexc, of the induced voltage Vi in each of the two corresponding detection coils 71 and 81, and of output voltage Vs from the assembly of these two coils, this first series I of curves being made in the absence of any external magnetic field Hext to be measured.

Likewise, the right half of this Figure is a second series II of the same four curves, but this time in the presence of an external magnetic field Hext to be measured.

The series of curves I shows that the excitation fields, as well as excitation flux φexc and induced voltages Vi, relative to half branches 101A and 101B of branch 101 of the core, are equal and of opposite signs. Output voltage Vs picked up at the output of the series and differential mounting of the two detection coils 71 and 81 is then zero in the absence of an external field Hext.

Conversely, the presence of an external magnetic field Hext, according to the series of curves II, offsets curve Hexc(t) towards the top, which causes a lack of symmetry between the two induced voltages Vi, and consequently, an output voltage Vs which is not zero and is formed by a series of alternately positive and negative pulses. These pulses are then rectified and smoothed to obtain a d.c. measurement voltage, as will now be seen with reference to FIG. 5 which is a synoptic and functional block diagram of the electronic circuit associated with one of the branches of core 10 of the sensor, for example branch 101.

Figure 5:
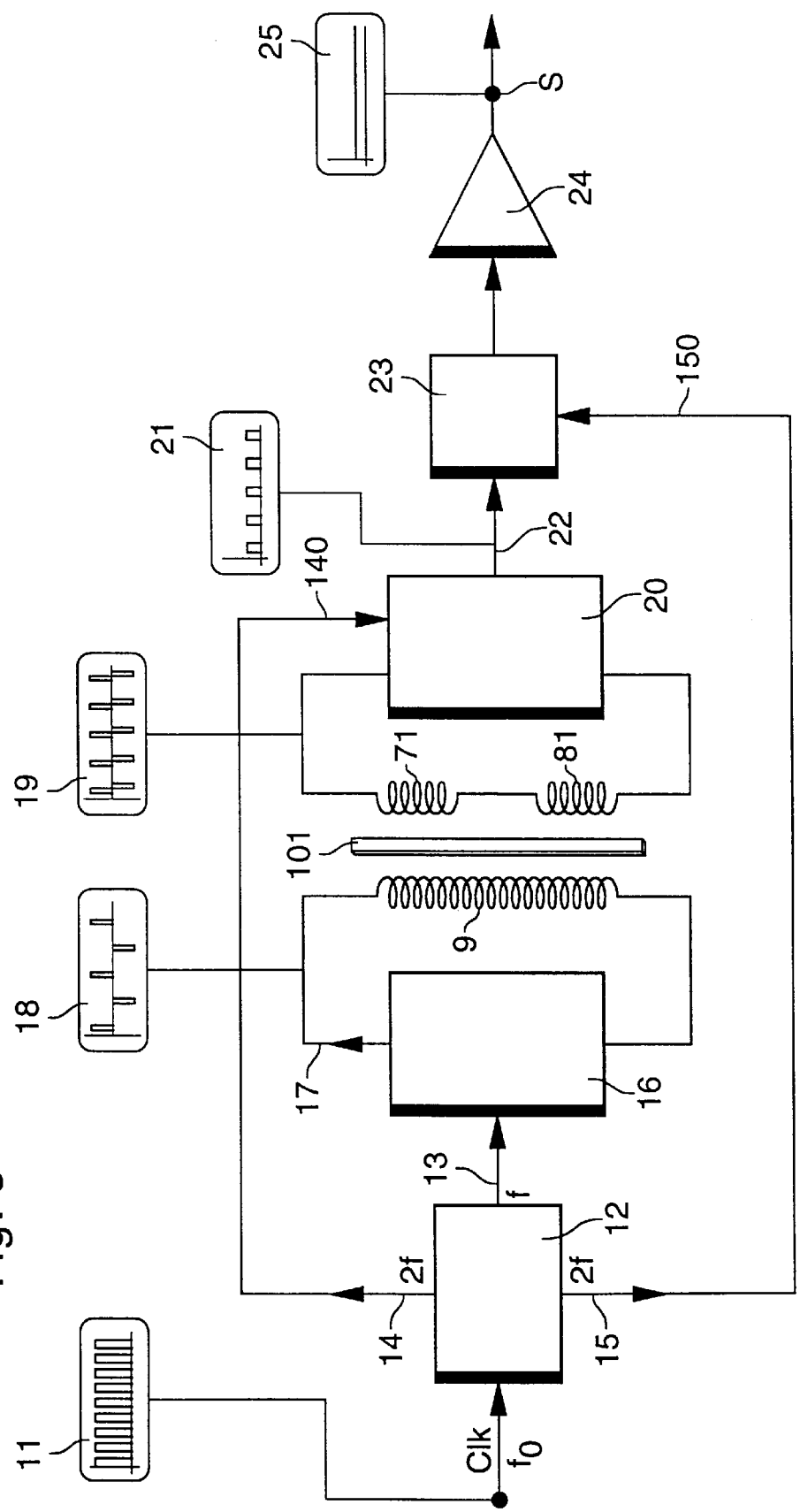
FIG. 5 is the synoptic electric diagram of the excitation and detection circuit which is associated to one of the two branches of the Greek cross-shaped core.

As is seen in FIG. 5, an external pulsed clock Clk is used, with a frequency $f_0$ and supplying pulses 11.

These pulses 11 are applied to a frequency divider circuit 12 which supplies several alternating periodic signals, namely:

two first phase shifted periodic signals of frequency f, for example equal to 125 Khz, at a first output 13;

two second Π phase shifted periodic signals, of frequency 2f, at a second output 14;

two third Π phase shifted periodic signals, of frequency 2f, at a third output 15.

The first two signals are applied to an elaboration and shaping circuit 16 which provides, at its output 17, an alternating excitation current 18 of relatively low duty cycle, for example 1/8, to excitation winding 9. The duty cycle of current 18 is determined by the phase shift of the first two signals. Preferably, circuit 16 is arranged so that the width of the pulses is equal to the temporal phase shift of these first two signals.

At the output of the assembly of the two detection coils 71, 81, one thus has a pulsed periodic induced signal 19, which is applied to a rectifier circuit 20, itself controlled at a frequency 2f by the connection 140 for obtaining rectified signal 21 at output 22 of rectifier 20. It will be noted that there is synchronous detection of the even harmonics of excitation frequency f.

This rectified signal 21 is then smoothed in a low-pass filter 23, controlled at a frequency 2f by the connection 150 so as to be active essentially for the duration of the induced pulses of rectified signal 21. The smoothed signal is then amplified in an amplifier 24 to obtain finally the d.c. measuring voltage 25 at output S of the sensor.

It goes without saying that the invention is not limited to the preferred embodiment example which has just been described.

Figure 6:
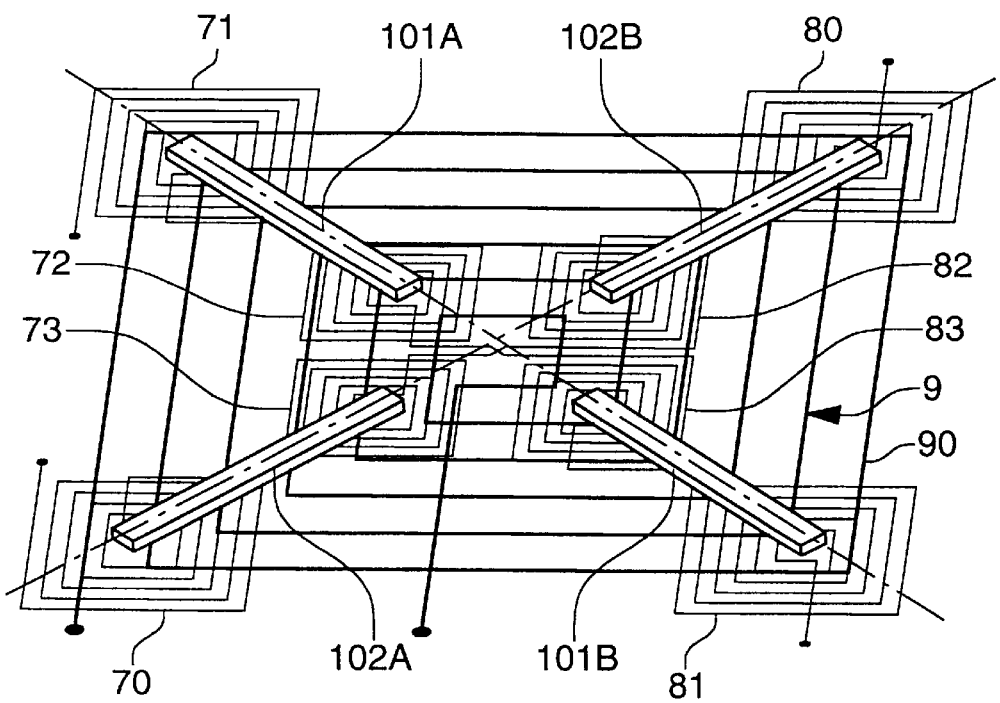
FIG. 6 illustrates another embodiment of the magnetic micro-sensor.

Thus, by way of example, FIG. 6 illustrates an alternative embodiment of the sensor, for which the amorphous ferromagnetic core is not, as previously, formed in a Greek cross all in one piece, but is formed of four core elements in distinct rectilinear half branches 101A, 101B, 102A, 102B, which are arranged as shown, and as in the preceding case, along the two diagonals of the square defined by excitation coil 9.

In such a case, the four detection coils 70, 71, 80, 81 are again found respectively placed under the free outer ends of the four core elements 101A, 101B, 102A, 102B, but four other detection coils 73, 72, 82, 83 are also found, which are respectively positioned under the free inner ends of these four core elements.

Figure 7:
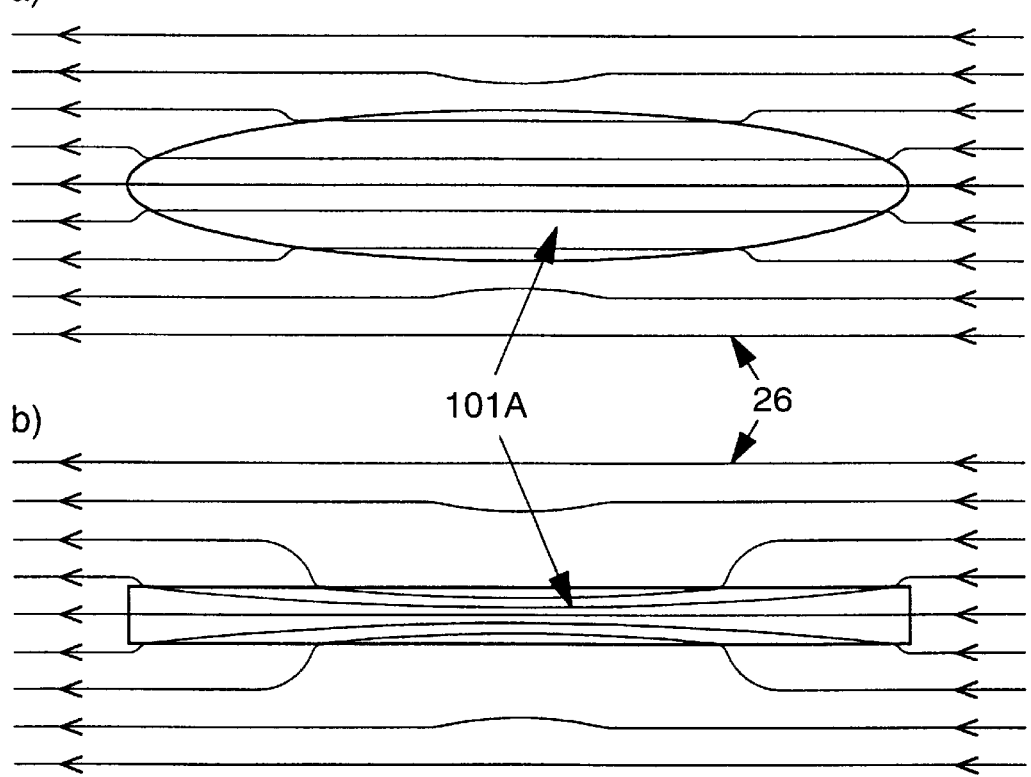
FIG. 7 illustrates the advantage, according to a variant, of giving an ellipsoidal shape to each of the amorphous magnetic bars which are fitted in particular to the magnetic sensor of FIG. 6.

Finally, FIG. 7 shows that it may be advantageous, which is also known, to replace each rectilinear core element, for example bar 101, with an element which is also long-limbed, but of ellipsoidal rather than parallelepiped shape. As the magnetic flux force lines 26 show clearly in both cases: a much greater uniformity of these force lines can be observed in the case of the ellipsoidal bar.

What is claimed is:

1. A substantially planar magnetic sensor, made on a semiconductor substrate, this sensor including:

at least one magnetic core which is substantially planar and made on a large planar face of said substrate;

at least one excitation circuit; and at least one detection circuit formed by at least two planar detection coils also made on said large face of the substrate, wherein said excitation circuit includes a single planar excitation coil with turns that form substantially concentric rectangles having progressively decreasing dimensions and defining two diagonals of said planar excitation coil, and wherein said at least one magnetic core comprises long-limbed parts arranged in a Greek cross along the two diagonals of said planar excitation coil, the two planar detection coils being respectively associated with said long-limbed parts along the two diagonals.

2. A magnetic sensor according to claim 1, wherein said at least one magnetic core is a single monoblock core which has the shape of a Greek cross arranged along said diagonals.

3. A magnetic sensor according to claim 2, wherein the detection circuit is formed by four detection coils which are respectively placed at the four free ends of said monoblock core, these four detection coils at least partially facing said planar excitation coil.

4. A magnetic sensor according to claim 1, wherein said excitation and detection circuits comprise electronic circuits made by CMOS integration techniques on said large face of the substrate.

5. A magnetic sensor according to claim 2, wherein said excitation and detection circuits comprise electronic circuits made by CMOS integration techniques on said large face of the substrate.

6. A magnetic sensor according to claim 3, wherein said excitation and detection circuits comprise electronic circuits made by CMOS integration techniques on said large face of the substrate.

7. A magnetic sensor according to claim 1, wherein said at least one magnetic core is formed by an amorphous material.

8. A magnetic sensor according to claim 2, wherein said at least one magnetic core is formed by an amorphous material.

9. A magnetic sensor according to claim 3, wherein said at least one magnetic core is formed by an amorphous material.

* * * * *